United States Patent
Miller

(10) Patent No.: US 7,388,424 B2
(45) Date of Patent: Jun. 17, 2008

(54) APPARATUS FOR PROVIDING A HIGH FREQUENCY LOOP BACK WITH A DC PATH FOR A PARAMETRIC TEST

(75) Inventor: Charles A Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 219 days.

(21) Appl. No.: 10/819,748

(22) Filed: Apr. 7, 2004

(65) Prior Publication Data

US 2005/0225382 A1    Oct. 13, 2005

(51) Int. Cl.
 *G01R 31/02*   (2006.01)
 *H03K 5/00*    (2006.01)
(52) U.S. Cl. .................................. 327/551; 324/754
(58) Field of Classification Search ............... 333/33, 333/202, 260, 247; 324/754, 761; 327/551–559
See application file for complete search history.

(56) References Cited

U.S. PATENT DOCUMENTS

| | | | | |
|---|---|---|---|---|
| 5,132,613 A | * | 7/1992 | Papae et al. | 324/754 |
| 5,974,662 A | * | 11/1999 | Eldridge et al. | 29/842 |
| 6,208,225 B1 | | 3/2001 | Miller | 333/202 |
| 6,218,910 B1 | | 4/2001 | Miller | 333/33 |
| 6,448,865 B1 | | 9/2002 | Miller | 333/33 |
| 6,459,343 B1 | | 10/2002 | Miller | 333/32 |
| 6,501,343 B2 | | 12/2002 | Miller | 333/33 |
| 6,538,538 B2 | * | 3/2003 | Hreish et al. | 333/246 |
| 6,606,014 B2 | | 8/2003 | Miller | 333/33 |
| 6,686,754 B2 | * | 2/2004 | Miller | 324/754 |
| 6,838,893 B2 | * | 1/2005 | Khandros et al. | 324/754 |
| 6,897,666 B2 | * | 5/2005 | Swettlen et al. | 324/754 |
| 6,917,210 B2 | * | 7/2005 | Miller | 324/754 |

* cited by examiner

*Primary Examiner*—Dinh T. Le
(74) *Attorney, Agent, or Firm*—N. Kenneth Burraston

(57) ABSTRACT

A high fidelity "loop-back" or interconnection of terminal pads of an IC on a wafer being tested in production is provided, while simultaneously a DC or low frequency path is provided back to a test system. Two or more IC pads are connected by probes forming the "loop-back," each probe forming an inductor, the probes being connected together through a trace in a substrate. A capacitor is then provided on a layer of the substrate connected to the trace to form a three-pole filter. To provide isolation of high frequency self-test signals between the probes and lower frequency signals of the test system, an inductor is placed in the path between the tester and probes. The inductor provides an "AC" or high frequency block between the test system and probes, while still allowing the test system to use DC or low frequency signals to verify continuity, leakage, and perform other DC parametric tests.

9 Claims, 5 Drawing Sheets

APPARATUS FOR PROVIDING A HIGH FREQUENCY LOOP BACK WITH A DC PATH FOR A PARAMETRIC TEST

BACKGROUND

1. Technical Field

The present invention relates in general to circuitry enabling transmission of high frequency signals through a connection, while simultaneously providing a DC path from the connection to an attached circuit with the high frequency AC signals to the attached circuit blocked. More particularly, the present invention relates to providing a high fidelity "loop-back" connection for transmission of self-test signals between two interconnected integrated circuit (IC) terminals while simultaneously providing a low frequency or DC path back to a tester used to test ICs on a wafer.

2. Related Art

Test systems to test integrated circuits on a wafer during production typically include a probe card containing spring probes for contacting IC pads on the wafer. The spring probes are supported on a substrate with routing lines included in the substrate to electrically connect the spring probes to a tester. The test signals provided from the tester typically are provided at a low frequency.

Sometimes ICs include high frequency circuits that are interconnected, or "looped-back" at the IC pads for self-test. The self-test signals are typically provided at a high frequency relative to test system signals. Interconnecting two such pads through a loop-back in a test system, thus, may not be practical because the high frequency signals cannot be provided through the test system.

Directly connecting the pads of the IC by hard wiring a connection to provide the "loop-back" without providing a path for test system signals, may not allow some necessary low frequency tests of the interconnection to be performed. A hard wired connection between IC pads with a separate connection to the test system may also not be practical because the high frequency signals provided through the IC interconnect line may adversely affect the test system.

FIG. 1 shows a block diagram of a test system using a probe card for testing Devices Under Test (DUTs) containing ICs on a semiconductor wafer. The test system includes a tester made up of a test controller 4 connected by a communication cable 6 to a test head 8. The test system further includes a prober 10 made up of a stage 12 for mounting a wafer 14 being tested, the stage 12 being movable to contact the wafer 14 with probes 16 on a probe card 18. The prober 10 includes the probe card 18 supporting probes 16 which contact DUTs formed on the wafer 14.

In the test system, test data is generated by the test controller 4 of the tester and transmitted through the communication cable 6, test head 8, probe card 18, probes 16 and ultimately to DUTs on the wafer 14. Test results are then provided from DUTs on the wafer back through the probe card 18 to the test head 8 for transmission back to the test controller 4. Once testing is complete, the wafer 14 is diced up to separate the DUTs.

Test data provided from the test controller 4 is divided into the individual tester channels provided through the cable 6 and separated in the test head 8 so that each channel is carried to a separate one of the probes 16. The channels from the test head 8 are linked by connectors 24 to the probe card 18. The probe card 18 then links each channel to a separate one of the probes 16.

FIG. 2 shows a cross sectional view of the probe head portion 20 of a typical probe card 18. Besides the probe head 20, a typical probe card 18 also typically includes components for mechanically supporting the probe head 20 relative to the wafer 14, and for electrically connecting the probe card 18 to the flexible cable connectors 24 of the test system that are not shown in FIG. 2.

The probe head 20 is made up of a space transformer substrate 22 that contains traces 26 to distribute or "space transform" signals from a Land Grid Array (LGA) made up of pads 32 provided on a first side 28 of the substrate 22 to spring probes 16 provided on the opposing second side 30. The signals from the connectors 24 are distributed to pads 32 forming the LGA. The space transformer substrate 22 is typically constructed from either multi-layered ceramic or multi-layered organic based laminates, effectively forming a Printed Circuit Board (PCB). The traces 26 are formed on one or more internal layers of the multi-layer substrate 22 and are interconnected by vias, such as via 23. The traces 26 typically include signal lines as well as power and ground lines. The power supply lines may be distributed on a separate layer of the substrate 22 from signal lines and separated by a ground plane to prevent signal interference. The space transformer substrate 22 with embedded circuitry, probes and LGA is referred to as the probe head 20.

Although shown with LGA pads 32 forming connections on the space transformer substrate 22, connection can be made to internal lines 26 using a further transmission line trace 34. The line 34 can be connected by a via to internal layers 26 of the space transformer substrate 22, or directly connected by a via through the substrate 22 to a spring probe 16.

The substrate 22 is shown in FIG. 2 forming the probe head 20 of the probe card 18, and providing space-transformation from pads 32 to match the routing pitch of probes 16, but a typical probe card 18 can include one or more additional PCBs. An additional PCB can provide further routing on internal layers to provide added space-transformation as design space requirements may dictate.

The pads 32 forming the LGA can be connected by a number of types of connectors either directly to the test head connectors 24, or through one or more additional PCB layers to the connectors 24. The connectors used for such an interconnection may include stamped or formed spring elements, pogo pins, ZIF flexible cable connectors, non-ZIF flexible cable connectors, conductive elastomer bumps, directly soldered wires, or other connectors as design constraints may require.

SUMMARY

In accordance with the present invention, a DC path is provided from a "loop-back" connection between pads of an IC to test circuitry without substantially degrading the high frequency characteristics of the interconnect between the IC pads.

In one embodiment two or more IC pads are connected together through spring probes of a probe head, each probe forming an inductor. The IC pads are directly connected on the probe head substrate, either by a trace line on a surface of the probe head substrate, or on an internal layer. In one embodiment, a capacitor is formed either using a printed element or a discrete component connected to the trace line. A three-pole low pass filter is, thus, created by the two probe inductors and capacitor. Such a filter can be formed that has an optimum response to frequency, phase and I/O impedance.

To provide isolation between high frequency self-test signals and lower frequency test system signals, an inductor is placed at the junction of the two probe inductors and the capacitor. The added inductor has a sufficiently large value to act as an "AC" or high frequency block to prevent the test system from degrading the high frequency path between the pads of the IC. The inductor is provided in the path back to the tester so that a DC path to the IC pads can still be verified for continuity, leakage, and other DC parametric tests.

BRIEF DESCRIPTION OF THE DRAWINGS

Further details of the present invention are explained with the help of the attached drawings in which.

DETAILED DESCRIPTION

Figure 1:
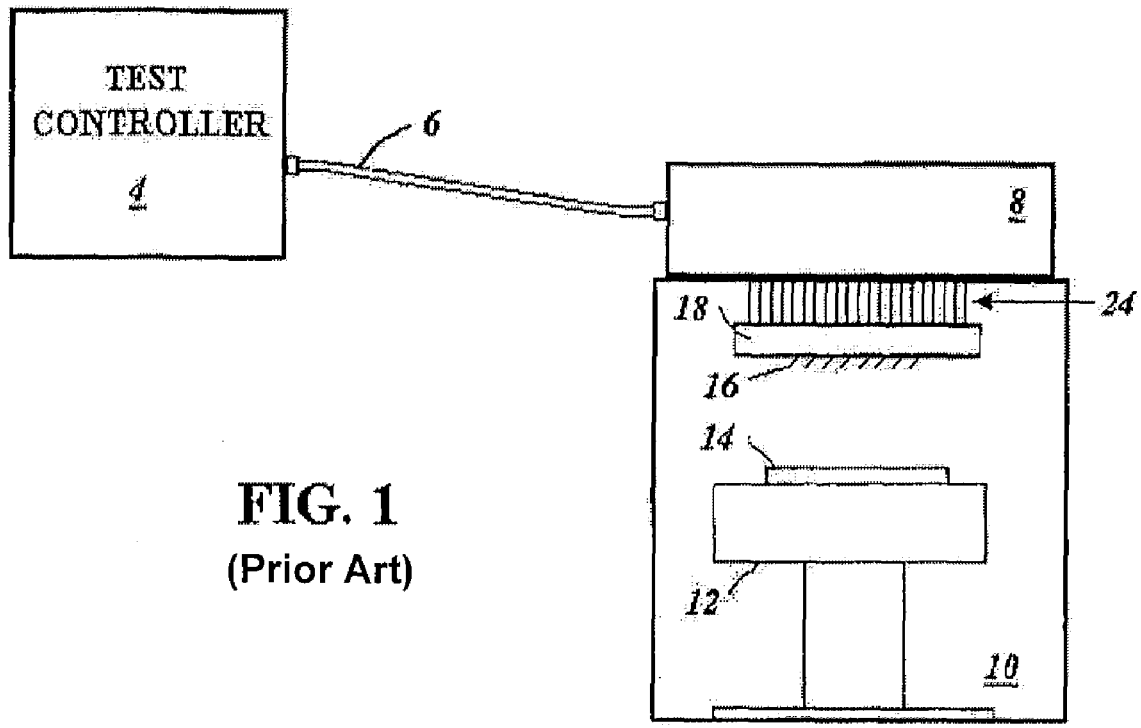
FIG. 1 shows a block diagram of components of a conventional wafer test system.
Figure 2:
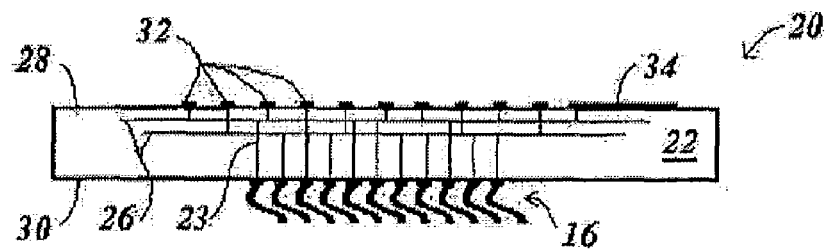
FIG. 2 is a cross sectional view of a probe head portion of conventional probe card for the wafer test system of FIG. 1.
Figure 3:
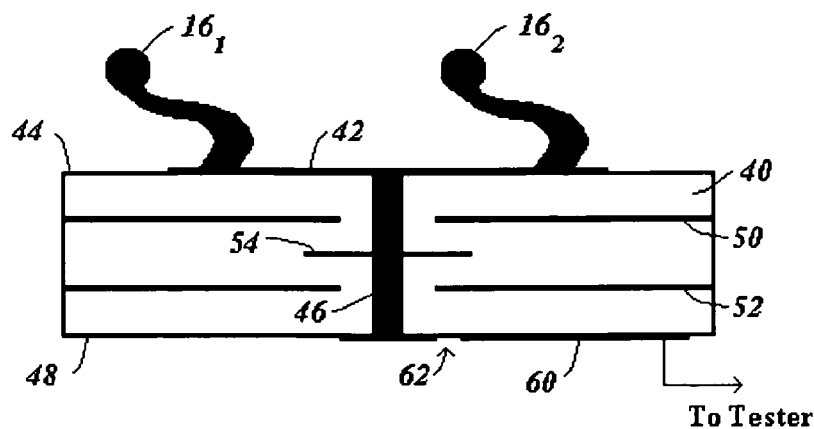
FIG. 3 is a cross sectional view of a portion of a probe head with a high fidelity loop back and filter provided in accordance with the present invention.

FIG. 3 is a cross sectional view of a portion of a probe head with components in accordance with the present invention. As shown, the probe head includes test probes $16_1$ and $16_2$ provided on a multi-layer substrate 40 of a probe head. The test probes $16_1$ and $16_2$ are interconnected by a trace 42 provided on a first surface 44 of the substrate 40 supporting the test probes. Although shown on surface 44, the trace 42 can be provided on an internal layer of the substrate 40. Although shown and described as spring contacts, the contact elements $16_1$ and $16_2$ may be solder bumps, wires, contact elements formed using photolithographic techniques, or other components such as pogo pins, buckling beams, tungsten needles, etc. for providing electrical contact to IC pads. The trace 42 interconnecting contact elements $16_1$ and $16_2$ is further connected by a via 46 provided through all the layers of the substrate 40 to the opposing substrate surface 48. The layers of the substrate 40 support power and ground lines 50 and 52, as shown in FIG. 3.

In one embodiment of the present invention, a capacitor is connected to the trace 42 between the probes $16_1$ and $16_2$. The capacitor can be discrete component attached to a line on a surface of substrate 40. The capacitor can likewise be a printed element, such as element 54 illustrated in FIG. 3 attached to via 46. The capacitor 54 is formed by a metal region provided on a surface of an internal layer of the substrate 40. As shown in a corresponding top view in FIG. 4, the element 54 in one embodiment is circular in shape and separated from the ground and power regions 50 and 52 (shown only in FIG. 3) to form a capacitor. With the probes $16_1$ and $16_2$ forming inductors, and the capacitor 54 attached, a low pass three-pole filter is formed. Such a filter can be tuned to provide an optimum response to frequency, phase and I/O impedance. Further details of forming such a filter is described in U.S. Pat. No. 6,538,538 entitled "High Frequency Printed Circuit Board Via," by Hreish, et al., and incorporated herein by reference.

A connection to the test system is shown in FIG. 3 provided though trace 60 provided on surface 48 of the substrate 40. Although shown as a trace 60, the test system connection can be made through a connector attached to the via 46, the connector being one of many possible types as described previously. For convenience, however, subsequent discussion of the test system connection will refer to trace 60.

The test system connection through trace 60 may only be desirable during initial testing to assure that the probes $16_1$ and $16_2$ are functional during manufacture of the probe card. Accordingly, the trace is shown provided with a break 62. The break 62 can be provided by laser cutting the trace line 60 after the substrate 40 is manufactured and testing is performed using the unbroken trace 60. The break 62 can also be provided by a discrete switch connected across the break 62. By using a switch, if after manufacture it is still desirable to use the test connection for testing at some times, yet not at other times, the switch can be turned on and off as desired.

Figure 4:
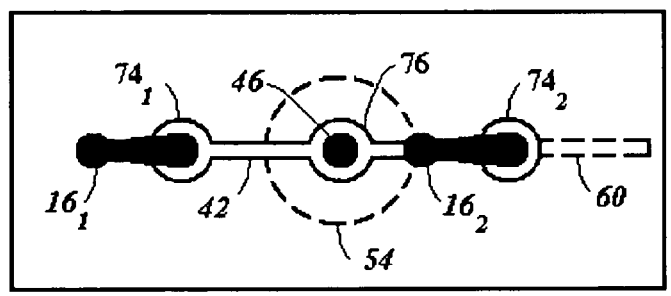
FIG. 4 is top view of the probe head probe shown in cross section in FIG. 3.

Apart from capacitor 54 referenced above, the top view of FIG. 4 illustrates other components of the probe head, including trace 42, probes $16_1$ and $16_2$, trace 60 and via 46. As shown the trace 42 is connected to probes $16_1$ and $16_2$ on circular pads $74_1$ and $74_2$. The via 46 is similarly provided through a circular connection pad 76.

Figure 5:
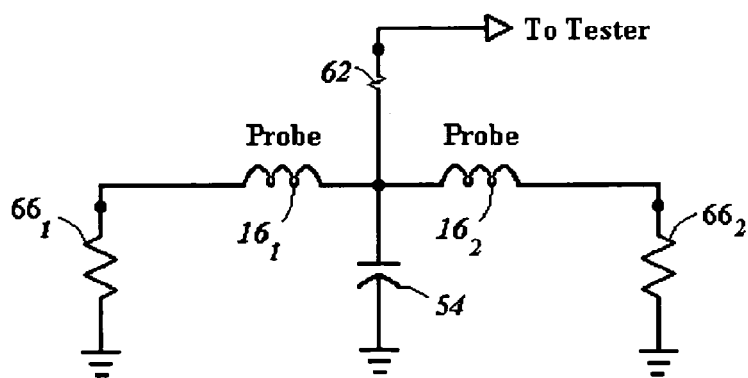
FIG. 5 is an equivalent circuit for the probe head shown in FIGS. 3-4 as connected for testing.

FIG. 5 provides an equivalent circuit for the probe head shown in FIGS. 3-4 as connected for testing. As illustrated in FIG. 5, the capacitor 54 and inductors $16_1$ and $16_2$ form a three-pole filter. The interconnection of the capacitor 54 and inductors $16_1$ and $16_2$ forms a connection line through break point 62 to the tester. The configuration of FIG. 5 further includes source and termination resistors $66_1$ and $66_2$ connecting respective probes $16_1$ and $16_2$ for the purposes of test measurements made and illustrated in FIG. 6.

Figure 6:
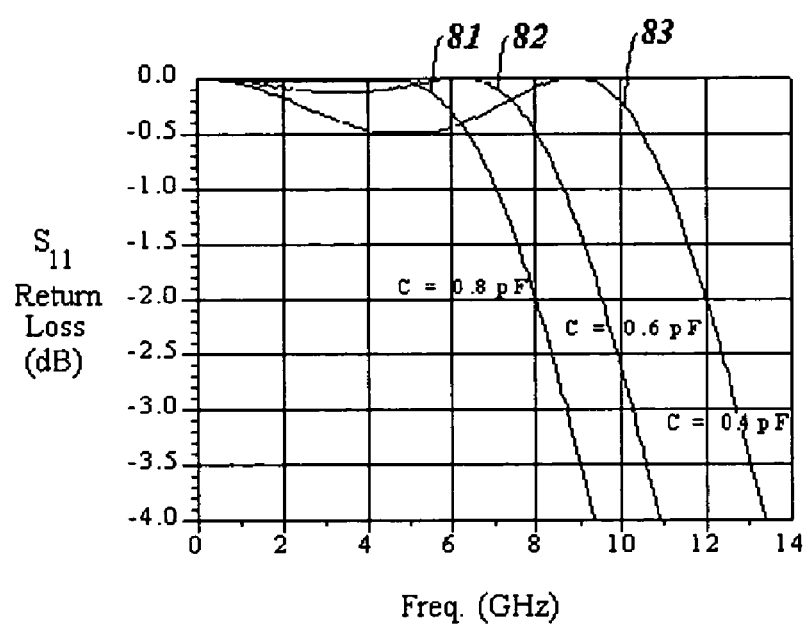
FIG. 6 is a graph plotting transfer characteristics of the probe head with circuitry illustrated in FIG. 5.

FIG. 6 shows a graph plotting transfer characteristics of the probe head with circuitry connected as shown in FIG. 5, using different values for the capacitor 54. The plots were run using a simulator assuming the inductance values for each of the probes $16_1$ and $16_2$ was 1.2 nH. A mutual inductance between probes $16_1$ and $16_2$ of 0.18 nH was further assumed. The probes were assumed to be terminated through 50 ohm resistances $66_1$ and $66_2$ connected to ground, as shown in FIG. 5. Three plots were provided with different values for the capacitor 54 connected to ground. Plot 81 was provided with capacitor 54 being 0.8 pF, plot 82 with the capacitor 54 being 0.6 pF and the plot 83 with the capacitor 54 being 0.4 pF. The test signal was measured through the test system connection from DC to 14 GHz with the results shown. As shown, the filter provides signals from DC up to at least 5 GHz with minimal loss.

Figure 7:
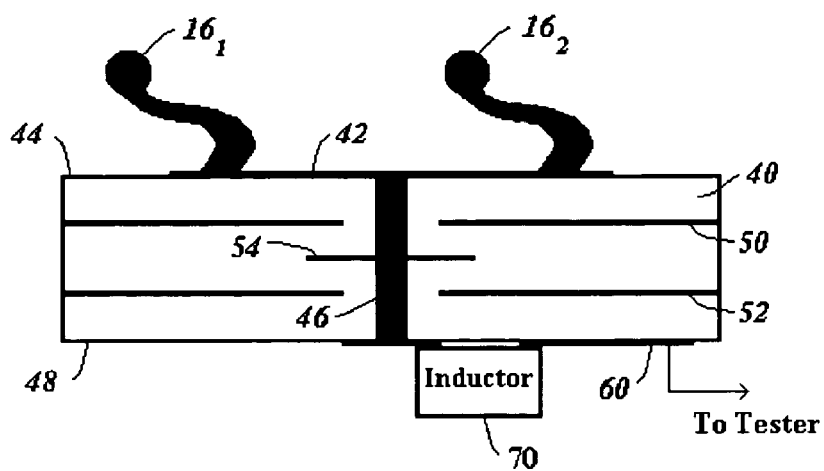
FIG. 7 is a cross sectional view of a probe head with a loop back and AC blocking inductor in accordance with the present invention.

FIG. 7 is a cross sectional view of a portion of a probe head with a loop back and with further modifications from the configuration in FIG. 3. For convenience, components carried over from FIG. 3 are similarly labeled, as are components carried over in subsequent figures. FIG. 7 modifies the circuit of FIG. 3 by adding an inductor 70 at the junction of the two inductors formed by probes $16_1$ and $16_2$ and capacitor 54. The inductor 70 is shown as a discrete element provided across the previously shown break point 62, although the inductor 70 could be provided as a printed element on the surface a surface of substrate 40, or on one of its internal layers. The inductor 70 is provided, as shown, in a signal path to the test system, which in FIG. 7 is along trace 60. Further details of placement of the inductor 70 is shown by the corresponding top view of FIG. 8.

The inductor 70 is provided with a sufficiently large value to create an "AC" or high frequency block between the tester and probes $16_1$ and $16_2$ so as to prevent degrading the high frequency path between the probes $16_1$ and $16_2$. The inductor provides a route to a tester so that the DC path to the IC nodes can be verified for continuity, leakage, and other DC parametric tests.

Figure 8:
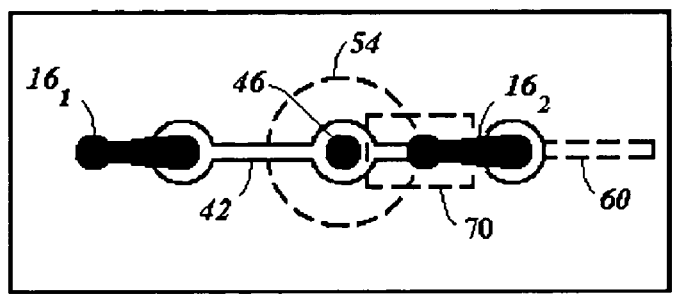
FIG. 8 is top view of the probe head portion shown in cross section in FIG. 7.
Figure 9:
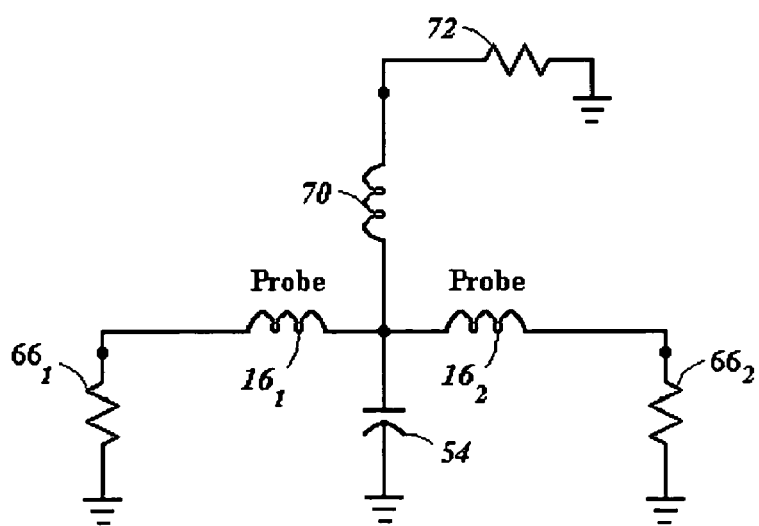
FIG. 9 is an equivalent circuit for the probe head shown in FIGS. 7-8 as connected for testing.
Figure 10:
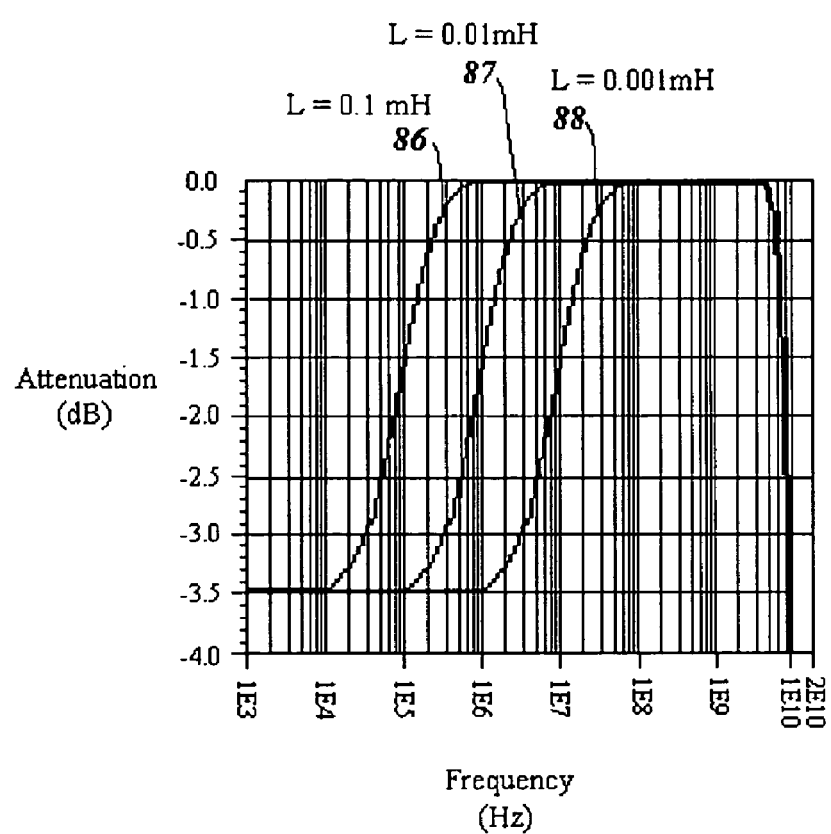
FIG. 10 is a graph plotting transfer characteristics of the probe head with circuitry illustrated in FIG. 9 with a termination provided at the test port.

FIG. 9 provides an equivalent circuit for the probe head shown in FIGS. 7-8 as connected for one test with results illustrated in FIG. 10. As with the equivalent circuit of FIG. 5, source and termination resistors $66_1$ and $66_2$ are provided connecting respective probes $16_1$ and $16_2$ to ground. Further a resistor 72 connected to system ground is provided in order to model the tester source or termination impedance connected to inductor 70. Note that FIG. 9 does not include the break point 62, as in FIG. 5, since the inductor that serves as an AC block eliminates the need for providing such a break point.

FIG. 10 is a graph plotting transfer characteristics of the circuit shown in FIG. 9, using different values for the inductor 70. The plots were run using a simulator assuming inductance values for each of the probes $16_1$ and $16_2$ of 1.2 nH, and a mutual inductance between the probes of 0.18 nH. The capacitor 54 was assumed to be 0.8 pF. Three plots were run with the inductor 70 being 0.1 mH in plot 86, 0.01 mH in plot 87 and 0.001 mH in plot 88. The test signal was measured at the junction of probes $16_1$ and $16_2$ from 1 KHz to 20 GHz with the 50 ohm termination 72 representing the tester source or termination impedance. As shown, the filter blocks signals outside the typical self-test signal range of 1 MHz-10 GHz from the probes.

Although inductive and capacitive components are described for tuning and providing AC blocking for interconnected contact elements of a substrate used in testing wafers, other configurations may be utilized for providing the inductive and capacitive elements in a test system. Such alternative configurations are described in U.S. Pat. No. 6,218,910 entitled "High Bandwidth Passive Integrated Circuit Tester Probe Card Assembly" by Charles A. Miller, which is incorporated herein by reference. Further, the inductive and capacitive components forming filters and via structures can be sized and placed to optimize the interconnect system impedance matching and frequency response characteristics as described in one or more of U.S. Pat. No. 6,448,865 entitled "Integrated Circuit Interconnect System," U.S. Pat. No. 6,208,225 entitled "Filter Structures For Integrated Circuit Interfaces," and U.S. Pat. No. 6,606,014 entitled "Filter structures For Integrated Circuit Interfaces," all by Charles A. Miller and incorporated herein by reference.

Although the present invention has been described above with particularity, this was merely to teach one of ordinary skill in the art how to make and use the invention. Many additional modifications will fall within the scope of the invention, as that scope is defined by the following claims.

What is claimed is:

1. A probe card providing isolation of high frequency signals from a test controller, the high frequency signals transmitted between components of at least one integrated circuit (IC), the probe card comprising:
   contact elements provided on a first surface of a substrate to make electrical contact with the at least one IC;
   a transmission line interconnecting at least two of the contact elements, the transmission line for carrying the high frequency signals between the at least two contact elements;
   an electrical connector configured to connect electrically the probe card to a test controller;
   a capacitor connected to the transmission line, the capacitor being part of a three pole filter; and
   an electrical path between the electrical connector and the transmission line, the electrical path comprising one of a break that electrically isolates the electrical connector from the transmission line or a switch configured to selectively connect and disconnect electrically the electrical connector and the transmission line.

2. The probe card of claim 1, wherein the transmission line comprises a trace provided on the first surface of the substrate with the contact elements, and wherein the substrate comprises multiple layers, the probe card further comprising:
   a via provided through the substrate connecting the transmission line to a pad on a second surface of the substrate, the electrical connector comprising the pad, wherein the capacitor is formed as a printed element between the layers of the substrate, the capacitor being connected to the via.

3. The probe card of claim 2, wherein the via is connected by a switch to the test controller.

4. The probe card of claim 1, wherein the contact elements comprise spring probes.

5. The method of claim 2, wherein the capacitor comprises a circular printed conductive element having a cross section greater than the via.

6. The probe card of claim 1 wherein the high frequency signals comprise self-test signals generated by the at least one IC.

7. The probe card of claim 1 wherein the high frequency signals have a frequency greater than about 10 MHz.

8. The probe card of claim 1, wherein the three pole filter has a cut off frequency of at least about five gigahertz.

9. The probe card of claim 1, wherein the three pole filter has a cut off frequency of at least about nine gigahertz.

* * * * *